(12) United States Patent
Lee et al.

(10) Patent No.: US 6,754,478 B1
(45) Date of Patent: Jun. 22, 2004

(54) CMOS LOW NOISE AMPLIFIER

(75) Inventors: Kyeongho Lee, Seoul (KR);
Deog-Kyoon Jeong, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 493 days.

(21) Appl. No.: 09/709,314

(22) Filed: Nov. 13, 2000

Related U.S. Application Data

(63) Continuation-in-part of application No. 09/121,863, filed on Jul. 24, 1998, now Pat. No. 6,194,947, and a continuation-in-part of application No. 09/121,601, filed on Jul. 24, 1998, now Pat. No. 6,335,952.
(60) Provisional application No. 60/164,874, filed on Nov. 12, 1999.

(51) Int. Cl.[7] .................................................. H04B 1/06
(52) U.S. Cl. ........................ 455/232.1; 455/252.1; 330/253; 330/254
(58) Field of Search ........................... 455/232.1, 234.1, 455/234.2, 241.1, 245.1, 245.2, 250.7, 252.1, 255, 259, 260; 330/252, 254, 259, 260, 278, 277, 282, 291, 295, 253

(56) References Cited

U.S. PATENT DOCUMENTS

| | | |
|---|---|---|
| 4,731,590 A | 3/1988 | Saari .......................... 330/278 |
| 4,755,774 A | 7/1988 | Heck ............................ 332/18 |
| 5,012,142 A | 4/1991 | Sonntag ....................... 327/158 |
| 5,175,729 A | 12/1992 | Borras et al. ................ 370/345 |
| 5,179,303 A | 1/1993 | Searles et al. ............... 327/277 |
| 5,180,994 A | 1/1993 | Martin et al. .................. 331/38 |
| 5,281,924 A * | 1/1994 | Maloberti et al. ........... 330/253 |
| 5,408,201 A | 4/1995 | Uriya ............................ 331/2 |
| 5,418,815 A | 5/1995 | Ishikawa et al. ............. 375/216 |
| 5,438,591 A | 8/1995 | Oie et al. ..................... 375/261 |
| 5,448,772 A | 9/1995 | Grandfield ................... 327/357 |
| 5,507,025 A | 4/1996 | Rodeffer ...................... 455/266 |
| 5,555,182 A | 9/1996 | Galm ............................ 702/69 |
| 5,584,062 A | 12/1996 | Meador et al. .............. 455/260 |
| 5,614,868 A | 3/1997 | Nielson ....................... 331/1 A |
| 5,640,146 A | 6/1997 | Campana et al. ........... 455/54.1 |
| 5,721,500 A * | 2/1998 | Karanicolas ................ 327/113 |
| 5,734,970 A | 3/1998 | Saito ............................ 455/76 |
| 5,761,617 A | 6/1998 | Yonekura et al. ........... 455/343 |
| 5,777,516 A * | 7/1998 | Koifman et al. ............. 330/277 |
| 5,794,119 A | 8/1998 | Evans et al. .................. 455/71 |
| 5,861,773 A | 1/1999 | Meyer ......................... 329/304 |
| 5,872,810 A | 2/1999 | Philips et al. ............... 375/222 |
| 5,878,087 A | 3/1999 | Ichihara ...................... 375/316 |
| 5,880,613 A | 3/1999 | Ishihara ...................... 327/202 |
| 5,889,437 A | 3/1999 | Lee .............................. 331/16 |
| 5,894,592 A | 4/1999 | Brueske et al. ............... 455/86 |
| 5,950,119 A | 9/1999 | McGeehan et al. ......... 455/302 |
| 5,963,855 A | 10/1999 | Lussenhop et al. ...... 455/226.2 |
| 6,029,059 A | 2/2000 | Bojer .......................... 327/361 |
| 6,084,905 A | 7/2000 | Ishifuji et al. ............... 375/202 |
| 6,097,768 A | 8/2000 | Janesch et al. .............. 375/330 |
| 6,118,984 A * | 9/2000 | Yu-Hong ...................... 455/76 |
| 6,163,215 A * | 12/2000 | Shibata et al. .............. 330/254 |
| 6,169,452 B1 | 1/2001 | Popescu et al. ............. 330/254 |
| 6,175,279 B1 | 1/2001 | Ciccarelli et al. ........... 330/296 |
| 6,194,947 B1 | 2/2001 | Lee et al. .................... 327/359 |
| 6,331,803 B1 * | 12/2001 | Zheng et al. ................ 330/254 |

* cited by examiner

*Primary Examiner*—Quochien B. Vuong
(74) *Attorney, Agent, or Firm*—Fleshner & Kim, LLP

(57) ABSTRACT

A CMOS low noise amplifier (LNA) is provided that is formed without inductors. The CMOS LNA can be used for a single-chip CMOS RF receiver. The CMOS LNA can include a plurality of amplification stages coupled between an input terminal and an output terminal and a gain controller coupled to each of the plurality of amplifier stages, wherein the CMOS LNA does not include an inductor. Each of the amplification stages can have a symmetrically configured and sized first and second circuits to increase a dynamic range and a feedback loop.

27 Claims, 3 Drawing Sheets

CM OS LOW NOISE AMPLIFIER

This application is a continuation-in-part of application Ser. No. 09/121,863 filed Jul. 24, 1998 U.S. Pat. No. 6,194,947 and Ser. No. 09/121,601 filed Jul. 24, 1998, U.S. Pat. No. 6,335,952 and claims priority to Provisional Application No. 60/164,874 filed Nov. 12, 1999, the contents of which are incorporated by reference.

BACKGROUND OF THE INVENTION

1. Field of the Invention

The present invention relates to an amplifier, and in particular, to a CMOS low noise amplifier (LNA) adaptable for use in a CMOS radio frequency (RF) communication system.

2. Background of the Related Art

Presently, CMOS low noise amplifiers (LNAs) are generally composed of a CMOS transistor and an on-chip inductor or an off-chip inductor. Such CMOS LNAs include common source type CMOS LNAs and common gate type CMOS LNAs. However, a completely CMOS LNA manufactured without an inductor has been a strong requirement previously lacking, for example, for use in a full CMOS radio frequency (RF) integrated communication system.

FIG. 1 is a diagram that illustrates a related art common source type CMOS LNA. As shown in FIG. 1, CMOS LNA 100 includes three spiral type inductors L1, L2 and L3, two transistors T1 and T2 and a capacitor C1. The first spiral inductor L1 receives an input signal RF IN at a first terminal, and the capacitor C1 is connected between a second terminal of the first spiral inductor L1 and a ground voltage. The LNA 100 further includes the second spiral inductor L2 connected by a first terminal to a power source voltage $V_{DD}$, a third spiral inductor L3 coupled by a first terminal to the ground voltage and the drains of first and second transistors T1, T2 commonly coupled in series between the spiral inductors L2 and L3. A gate of the first transistor T1 is connected to receive a bias voltage BIAS, and a gate of the second transistor T2 is connected to the second terminal of the first spiral inductor L1. A source electrode of transistor T1 and the second terminal of spiral inductor L2 form an output node that outputs an output signal RF OUT.

FIG. 2 is a diagram that illustrates a related art common gate type CMOS LNA. As shown in FIG. 2, CMOS LNA 200 includes two spiral inductors L4 and L5, a capacitor C2 and a transistor T3. The LNA 200 includes a first spiral inductor L5 having a first terminal that receives an input signal RF IN and a second terminal connected to a ground voltage. A capacitor C2 is connected in parallel between the first terminal of the first spiral inductor L5 and the ground voltage. The second spiral inductor L4 is connected to a source electrode of a transistor T3 in series between a power source voltage $V_{DD}$ and the first terminal of the spiral inductor L5. The interconnection between the spiral inductor L4 and the transistor T3 forms an output node transmitting an output signal RF OUT. The gate electrode of the transistor T3 is connected to a bias voltage BIAS.

The related art CMOS LNAs have various disadvantages. When the inductance for the related art CMOS LNAs is implemented by using an on-chip inductor such as a spiral inductor, the on-chip spiral inductor cannot guarantee required performance characteristics and cannot provide acceptable yields during mass-production fabrication. When the inductance for the related art CMOS LNAs is an off-chip inductor element, the off-chip inductors can cause a more complicated fabrication process, board layout and generates cost-increment in an overall system such as a CMOS RF communication system. Further, required connections to off-chip elements reduce performance characteristics.

The above descriptions are incorporated by reference herein where appropriate for appropriate teachings of additional or alternative details, features and/or technical background.

SUMMARY OF THE INVENTION

An object of the invention is to solve at least the above problems, and/or disadvantages and to provide at least the advantages described hereinafter.

Another object of the present invention is to provide a LNA formed without an inductor.

Another object of the present invention is to provide a CMOS LNA formed without a spiral type on-chip inductor.

Another object of the present invention is to provide a reduced cost CMOS LNA.

Another object of the present invention is to provide a CMOS RF communication system using a LNA without an inductor.

Another object of the present invention is to provide a CMOS LNA having a simpler process for mass production and increased yield.

Another object of the present invention is to provide a CMOS LNA having first and second gain control stages.

Another object of the present invention is to provide a CMOS LNA having an increased dynamic range.

Another object of the present invention is to provide a CMOS LNA having first and second gain controlled stages each including first and second symmetric networks.

Another object of the present invention is to provide a CMOS LNA having first and second gain controlled stages each including first and second symmetric networks to allow a symmetric full-up and full-down operations.

To achieve at least the above objects and advantages in a whole or in parts and in accordance with the purpose of the present invention, as embodied and broadly described, there is provided a CMOS low noise amplifier (LNA) that includes a plurality of amplification stages coupled between an input terminal and an output terminal and a gain controller coupled to each of the plurality of amplifier stages, wherein the CMOS LNA does not include a spiral inductor.

To further achieve at least the above objects and advantages in a whole or in parts and in accordance with the purpose of the present invention, as embodied and broadly described, there is provided an amplification stage for a low noise amplifier (LNA) that includes first and second circuits coupled between an input node and an output node, wherein the first and second circuits have a symmetric configuration and a feedback loop coupled between the output node and the second circuit.

To further achieve at least the above objects and advantages in a whole or in parts and in accordance with the purpose of the present invention, as embodied and broadly described, there is provided a CMOS low noise amplifier (LNA) that includes a first amplifier stage that receives an input RF signal, wherein the first amplifier stage includes first and second symmetric networks and a feedback loop, a second amplifier stage coupled to an output node of the first amplifier stage, wherein the second amplifier stage includes the first and second symmetric networks and the feedback loop and a gain controller coupled to each of the first symmetric networks of the first and second amplifier stages, wherein the second amplifier stage transmits an amplified RF output signal responsive to a control signal of the gain controller.

To further achieve at least the above objects and advantages in a whole or in parts and in accordance with the purpose of the present invention, as embodied and broadly described, there is provided an RF CMOS communication system, that includes an antenna that receives RF signals having a carrier frequency, a phase lock loop that generates a local oscillator signal, a RF filter coupled to the antenna that filters the received RF signals, a demodulation mixer that mixes the filtered received RF signals with the local oscillator to output demodulated signals having a frequency reduced by the local oscillator, a modulation mixer that mixes the local oscillator signals with transmission data to modulate the transmission data, a power amplifier that amplifies the modulated transmission data and transmits the data to the transceiver for transmission and a CMOS low noise amplifier (LNA) coupled between the RF filter and the demodulation mixer that amplifies the filtered RF signals, wherein the CMOS LNA is formed without inductors.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
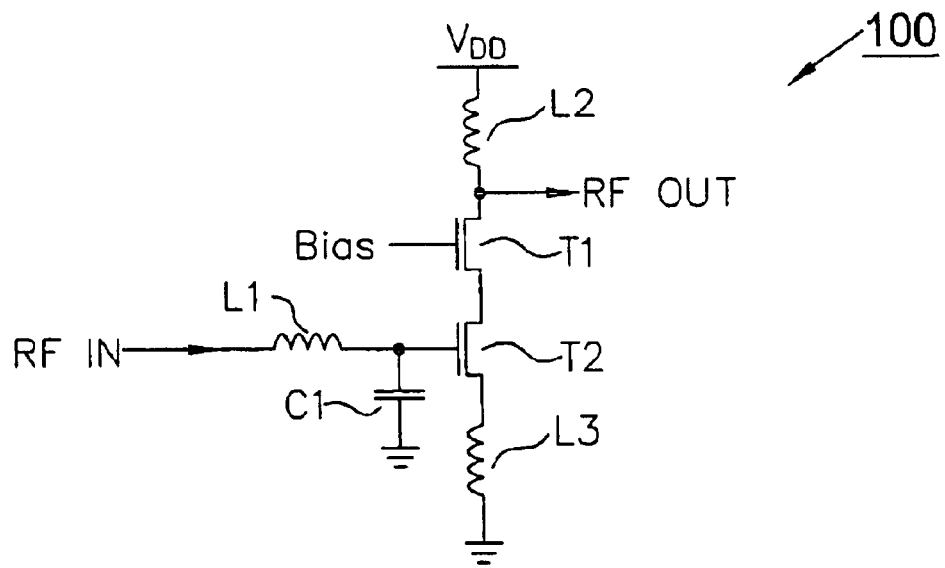
FIG. 1 is a circuit diagram showing a related art CMOS LNA.
Figure 2:
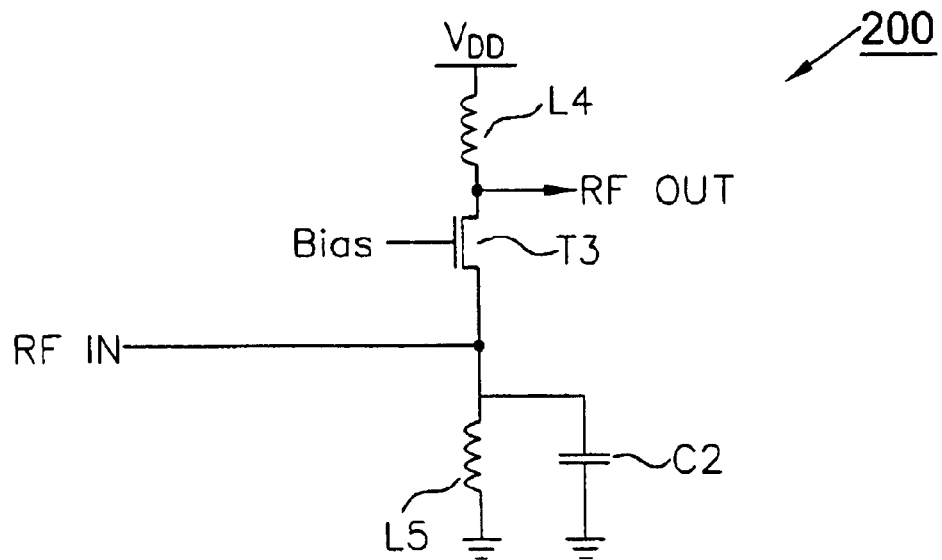
FIG. 2 is a diagram showing another related CMOS LNA.
Figure 3:
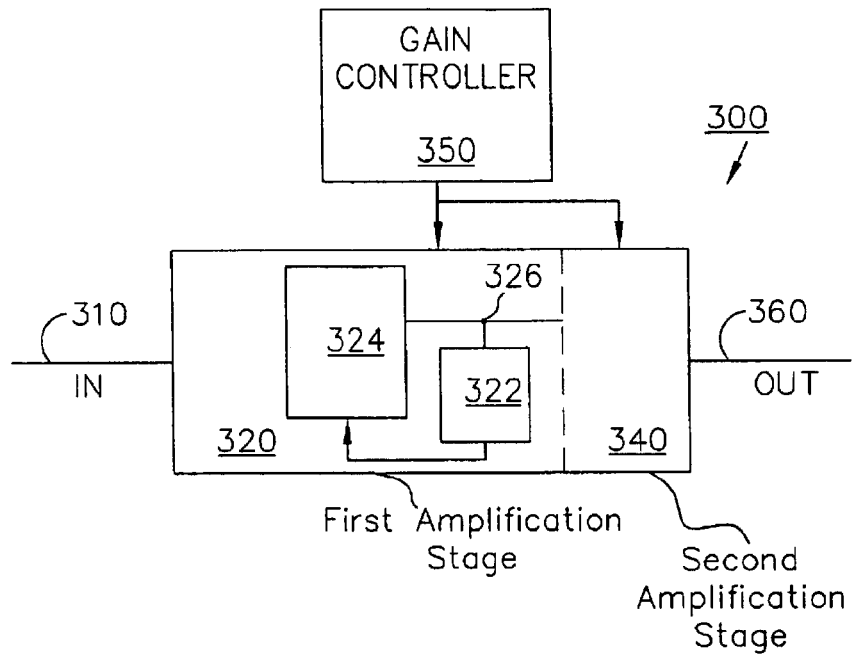
FIG. 3 is a block diagram that illustrates a preferred embodiment of a CMOS LNA according to the present invention.

FIG. 3 is a block diagram that illustrates a first preferred embodiment of a CMOS LNA according to the present invention, which preferably provides better linearity and gain controllability and is formed without inductors. The CMOS LNA 300 includes an input terminal 310 preferably coupled to received an RF signal input IN, a first amplification stage 320 coupled to the input terminal 310, a second amplifier stage 340 coupled to an output node 326 of the first amplification stage 320 and an output terminal 360 that preferably transmits an RF output signal OUT. Further, the CMOS LNA 300 includes a gain controller 350 coupled to the first and second amplification stages 320, 340.

The first preferred embodiment of the CMOS LNA is composed of two amplification stages, which can achieve the desired gain for the CMOS LNA 300 adapted for use in a CMOS RF communications system. Each of the first and second amplification stages 320, 340 preferably has an identical configuration. However, the present invention is not intended to be so limited. The first amplification stage 320 as shown in FIG. 3 includes a feedback loop 322 coupled between the output node 326 and a first amplifier circuit 324 of the first amplifier stage 320. The feedback loop 322 preferably establishes a DC bias point of the output node 326 of the first amplification stage 320.

The first amplification stage 320 preferably includes a symmetric CMOS network to increase a dynamic range of the CMOS LNA 300, in particular, under large RF signal inputs IN. Further, the gain of the CMOS LNA 300 can be controlled by using the gain controller 350. Preferably, the gain controller 350 includes a current source I. The current level provided by the current source I of the gain controller 350 is preferably copied on both of the first and second amplifier stages 320, 340. For example, the current level can be copied using a current mirror or the like.

Figure 4:
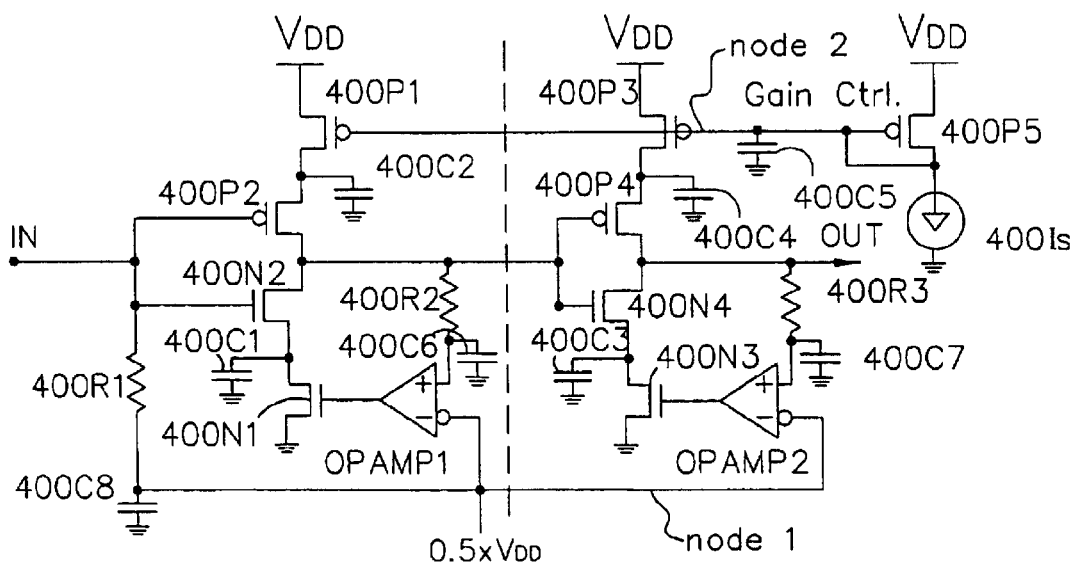
FIG. 4 is a circuit diagram that illustrates a preferred embodiment of a CMOS LNA according to the present invention.

FIG. 4 is a circuit diagram that illustrates in more detail the first preferred embodiment of the CMOS LNA 300 of FIG. 3. The CMOS LNA 300 can be a starved inverter type LNA. As shown in FIG. 4, the first amplifier circuit 324 includes four transistors 400P1, 400P2, 400N2 and 400N1 coupled in series between a power source voltage $V_{DD}$ and a ground voltage. The input terminal 310 is coupled to gate electrodes of the transistors 400P2 and 400N2 whose drains are coupled in common to form the output terminal 326 of the first amplification stage 320. Further, a capacitor 40C2 is coupled between the ground voltage and a junction coupling the transistors 400P1 and 400P2, and a capacitor 400C1 is coupled between the ground voltage and a junction coupling the transistors 400N2 and the transistors 400N1.

The second amplifier stage 340 includes four transistors 400P3, 400P4, 400N4, 400N3 coupled in series between the power source voltage $V_{DD}$ and the ground voltage. Further, gate electrodes of the transistors 400P4 and 400N4, each having drains commonly coupled to form an output node of the second amplification stage 340, are coupled to the output node 326 of the first amplification stage 320. As shown in FIG. 4, the output node of the second amplification stage 340 is also the output terminal 360. Further, capacitors 400C4 and 400C3 are coupled between the ground voltage and junctions coupling the transistors 400P3 and 400P4 and the transistors 400N4 and 400N3, respectively.

The feedback loop 322 of the first amplification stage 320 includes a resistor 400R2, a capacitor 400C6, an operational amplifier OPAMP1 and the transistor 400N1. The resistor 400R2 is coupled between the output node 326 of the first amplifier circuit 324 and a non-inverting input of the OPAMP1. The capacitor 400C6 is coupled between the ground voltage and the non-inverting input of the OPAMP1. The output of the OPAMP1 is coupled to the gate electrode of the transistor 400N1, and an inverting input of OPAMP1 is coupled to a voltage node 1.

As shown in FIG. 4, a resistor 400R1 and capacitor 400C8 are coupled between the input terminal 310 and the ground. The voltage node 1 is coupled to a junction between the resistor 400R1 and the capacitor 400C8. The feedback loop 322 including the resistor 400R2, the capacitor 400C6, the OPAMP1 and the transistor 400N1 establish the DC bias point of the output node 326 of the first amplification stage 320 and the input of the second amplification stage 340, which is preferably adjusted to 0.5 $V_{DD}$ for coupling to the voltage node 1.

In a similar manner, a feedback loop of the second amplification stage 340 includes a resistor 400R3, a capacitor 400C7, an operational amplifier OPAMP2 and the transistor 400N3, which receives an output of the OPAMP2 at a gate electrode. Similar to the feedback loop 322, the resistor 400R3 is coupled between an output node of the second amplification stage 340 and a non-inverting terminal of the OPAMP2. The capacitor 400C7 is coupled between the ground voltage and the non-inverting terminal of the OPAMP2. An inverting terminal of the OPAMP2 is coupled to the voltage node 1.

Preferably, the transistors 400P1–400P4 are PMOS type transistors and the transistors 400N1–400N4 are NMOS type transistors. As can be appreciated, the preferred embodiment is not limited to such transistor type.

The gain controller 350 includes transistor 400P5 and current source 400Is coupled in series between the power source voltage $V_{DD}$ and the ground voltage. Further, a gate electrode of the transistor 400P5 is commonly coupled to a drain electrode connected to the current source 400Is. In addition, the gate electrode of the transistor P5 is commonly coupled to a gate electrode of the transistor 400P1, a gate electrode of the transistor 400P3 and a capacitor 400C5, which is also coupled to the ground voltage.

The 0.5 $V_{DD}$ bias and symmetric PMOS and NMOS networks of the first and second amplification stages 320, 340 enable symmetric operating points so that the PMOS and NMOS networks have an increased or maximum headroom and an increased or maximum dynamic range especially under a large RF signal input received at the input terminal 310. The 0.5 $V_{DD}$ bias also enables transistors 400N2, 400P2, 400N4 and 400P4 to operate in a saturation region even when the large RF input signal is received.

The resultant gain of the first amplification stage can be determined from the transconductance of the transistor 400P2 and the transistor 400N2 (e.g., $gm_{400P2}+gm_{400N2}$) and a resultant output impedance of a parallel combination of the transistors 400P2 and 400N2 (e.g., $ro_{400P2}\|ro_{400N2}$), which is $GAIN_{1st} = (gm_{400P2}+gm_{400N2})\times(ro_{400P2}\|ro_{400N2})$. In similar way, the gain of the second amplification stage is determined as $GAIN_{2nd} = (gm_{400P4}+gm_{400N4})\times(ro_{400P4}\|ro_{400N4})$. Should the first preferred embodiment of the CMOS LNA 300 not have a symmetric structure, a full-down and full-up conditions would have different headroom and different characteristics, which would result in signal distortion depending upon the full-down and full-up conditions and decrease the linearity of such a CMOS LNA.

In addition, the gain of the first preferred embodiment of the CMOS LNA 300 can be controlled by changing a value of the current source 400Is. A current level from the current source 400Is can be copied at each of the first and second amplifier stages 320, 340 preferably through a current mirror composed of the transistors 400P5, 400P3 and 400P1. By increasing the value of the current source 400Is, the transconductance of the transistors 400P2, 400N2, 400P4 and 400N4 increases, which results in an increment in gain. The capacitors 400C6 and 400C7 are preferably used to stabilize the two feedback loops of the first amplification stage 320 and the second amplification stage 340, respectively. The capacitors 400C1–400C5 and 400C8 are preferably used to make AC-ground.

Figure 5:
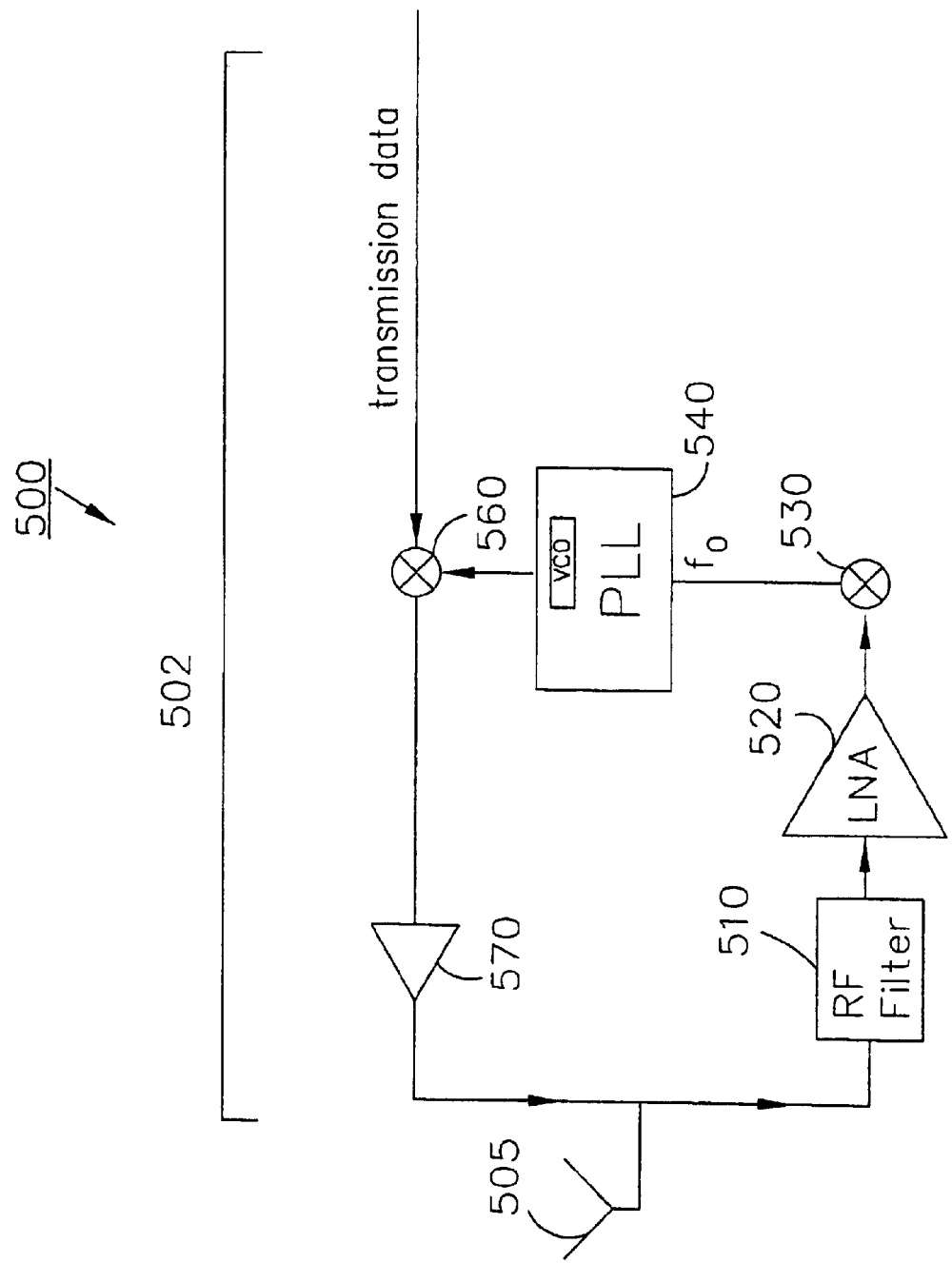
FIG. 5 is a diagram that illustrates a preferred embodiment of an RF communication system.

FIG. 5 is a diagram that illustrates a preferred embodiment of an RF communication system used to generate de-modulated signal output (e.g., base band). An RF section 562 can include an antenna 505, and RF filter 510 (e.g., band-pass filter), low noise amplifier (LNA) 520 and first and second mixers 530 and 560 respectively. The RF section 502 can further include a phase-locked loop (PLL) 540, and a power amplifier 570 coupled between the second mixer 560 and the antenna 505. The PLL 540 generates a modulating and de-modulating clock (e.g. local oscillator) whose frequency can be determined by a reference clock. The LNA 520 can include a plurality of amplification stages with first and second symmetric circuits, a gain controller and a feedback loop as described above.

As described above, preferred embodiments of a CMOS LNA and methods of using same provide a desired gain for the wide frequency range, not at just a selected frequency. Further, if higher gain is required, a number of stages of the CMOS LNA can be increased. In addition, alternative embodiments of a gain controller can be used according to the present invention. For example, the gain can be controlled by putting and controlling load capacitance of each stage. Such a circuit for load capacitance control can be implemented by series connection of a pass-transistor and a capacitor, and the voltage of a gate electrode of the pass-transistor can be controlled to control an effective load capacitance.

As described above, preferred embodiments and methods for using same of a CMOS LNA according to the present invention have various advantages. The preferred embodiments according to the present invention provide a CMOS LNA that does not use an inductor. The preferred embodiments of the LNA can use a simplified manufacturing process. Further, the preferred embodiments of the CMOS LNA have symmetric amplification stages that allow symmetric pull-up and pull-down operations while achieving a desired gain. In addition, the preferred embodiments provide an increased linear performance.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A CMOS low noise amplifier (LNA), comprising:
    a plurality of amplification stages coupled between an input terminal and an output terminal; and
    a gain controller coupled to each of the plurality of amplifier stages, wherein each of the amplification stages comprises first and second symmetric circuits, and wherein said each amplification stage has a single input terminal.

2. The CMOS LNA of claim 1, wherein said each of the amplification stages comprises:
    a feedback loop coupled between an output node of said each amplification stage and the second symmetric circuit, wherein the second circuit comprises,
        first and second NMOS type transistors coupled in series between the output node of the amplification stage and a second prescribed voltage, and
        a second capacitor coupled between the second prescribed voltage and a junction coupling the first and second NMOS type transistors.

3. The CMOS LNA of claim 1, wherein the first circuit comprises:
    first and second PMOS type transistors coupled in series between a first prescribed voltage and a corresponding output node of the amplification stage; and
    a first capacitor coupled between a second prescribed voltage and a junction coupling the first and second PMOS type transistors, wherein the second circuit comprises, first and second NMOS type transistors coupled in series between the output node of the amplification stage and the second prescribed voltage, and a second capacitor coupled between the second prescribed voltage and a junction coupling the first and second NMOS type transistors.

4. The CMOS LNA of claim 3, wherein the feedback loop comprises:

a first operational amplifier having an output coupled to a control electrode of the second NMOS type transistor;

a first resistor coupled to the output node of the amplification stage and a first input of the first operational amplifier; and a third capacitor coupled between the second prescribed voltage and the first input of the operational amplifier, and wherein a second input terminal of the first operational amplifier is coupled to a third prescribed voltage, wherein a level of the third prescribed voltage is between levels of the first and second prescribed voltages.

5. The CMOS LNA of claim 4, further comprising:

a second resistor coupled to the input terminal; and a fourth capacitor coupled in series between the second resistor and the second prescribed voltage, wherein a junction coupling the second resistor and the fourth capacitor provides the third prescribed voltage.

6. The CMOS LNA of claim 5, wherein the first and second input terminals of the first operational amplifier are the non-inverting and inverting amplifiers, respectively.

7. The CMOS LNA of claim 5, wherein the gain controller comprises:

a gain transistor and a gain current source coupled in series between the first prescribed voltage and the second prescribed voltage; and a gain capacitor coupled between the second prescribed voltage and a control electrode of the gain transistor, and wherein a control electrode and a second electrode of the gain transistor are coupled together.

8. The CMOS LNA of claim 7, wherein the gain controller and first PMOS type transistors of the amplification stages comprise a current mirror, and wherein the third prescribed voltage is one-half the first prescribed voltage.

9. The CMOS LNA of claim 1, wherein the gain controller comprises:

a gain transistor and a gain current source coupled in series between the first prescribed voltage and the second prescribed voltage; and a gain capacitor coupled between the second prescribed voltage and a control electrode of the gain transistor, and wherein a control electrode and a second electrode of the gain transistor are coupled together.

10. The CMOS LNA of claim 1, wherein the CMOS LNA is formed on a single chip, and wherein the CMOS LNA receives an input RF signal in a range of approximately 1.8 GHz–2.4 GHz.

11. The CMOS LNA of claim 1, wherein each symmetric circuit comprises:

first and second transistors coupled in series between a prescribed voltage and an output node of the corresponding amplification stage; and a capacitor coupled to a junction connecting the first and second transistors.

12. The CMOS LNA of claim 1, wherein each symmetric circuit is connected to the single input terminal.

13. The CMOS LNA of claim 1, wherein the CMOS LNA does not include a spiral inductor.

14. An amplification stage for a low noise amplifier (LNA), comprising:

first and second circuits coupled between an input node and an output node, wherein the first and second circuits have a symmetric configuration, wherein each of the first and second symmetric circuits is configured to receive a single input; and a feedback loop coupled between the output node and the second circuit.

15. The amplification stage of claim 14, wherein the first circuit comprises:

first and second PMOS type transistors coupled in series between a first prescribed voltage and the output node of the amplification stage; and a first capacitor coupled between a second prescribed voltage and a junction coupling the first and second PMOS type transistors, wherein the second circuit comprises, first and second NMOS type transistors coupled in series between the output node of the amplification stage and the second prescribed voltage, and a second capacitor coupled between the second prescribed voltage and a junction coupling the first and second NMOS type transistors, wherein the first and second circuits are symmetric.

16. The amplification stage of claim 14, wherein the feedback loop comprises:

a first operational amplifier having an output coupled to a control electrode of the second NMOS type transistor;

a first resistor coupled to the output node of the amplification stage and a first input of the first operational amplifier; and a third capacitor coupled between the second prescribed voltage and the first input of the operational amplifier, and wherein a second input terminal of the first operational amplifier is coupled to a third prescribed voltage, wherein a level of the third prescribed voltage is between levels of the first and second prescribed voltages.

17. The amplification stage of claim 16, wherein the amplification stage is on a single chip and does not use a spiral inductor.

18. A CMOS low noise amplifier (LNA), comprising:

a first amplifier stage that receives an input RF signal, wherein the first amplifier stage includes first and second symmetric networks and a feedback loop;

a second amplifier stage coupled to an output node of the first amplifier stage, wherein the second amplifier stage includes the first and second symmetric networks and the feedback loop, wherein each of the first and second symmetric networks is configured to receive a single input; and a gain controller coupled to each of the first symmetric networks of the first and second amplifier stages, wherein the second amplifier stage transmits an amplified RF; output signal responsive to a control signal of the gain controller.

19. The CMOS LNA of claim 18, wherein said each of the first and second symmetric networks is configured to receive the same single input.

20. The CMOS LNA of claim 19, wherein the first symmetric network comprises:

first and second first-conduction type transistors coupled in series between a first prescribed voltage and a corresponding output node of the amplification stage; and a first capacitor coupled between a second prescribed voltage and a junction coupling the first and second first-conduction type transistors, wherein the second symmetric network comprises,
first and second second-conduction type transistors coupled in series between the output node of the amplification stage and the second prescribed voltage, and
a second capacitor coupled between the second prescribed voltage and a junction coupling the first and second second-conduction type transistors.

21. An RF communication system, comprising:
an antenna that receives RF signals having a carrier frequency;
a phase lock loop that generates a local oscillator signal;
a RF filter coupled to the antenna that filters the received RF signals;
a demodulation mixer that mixes the filtered received RF signals with the local oscillator to output demodulated signals having a frequency reduced by the local oscillator;
a modulation mixer that mixes the local oscillator signals with transmission data to modulate the transmission data;
a power amplifier that amplifies the modulated transmission data and transmits the data to the antenna for transmission; and
a CMOS low noise amplifier (LNA) coupled between the RF filter and the demodulation mixer that amplifies the filtered RF signals, wherein the CMOS LNA comprises,
a plurality of amplification stages coupled between an input terminal and an output terminal, and
a gain controller coupled to each of the plurality of amplifier stages, wherein each of the amplification stages comprises,
first and second symmetric circuits, wherein each of the first and second symmetric circuits comprise a transistor directly connected to a prescribed capacitor, and
a feedback loop coupled between an output node of said each amplification stage and the second symmetric circuit.

22. The RF communication system of claim 21, wherein the first symmetric circuit comprises:
first and second PMOS type transistors coupled in series between a first prescribed voltage and a corresponding output node of the amplification stage; and
a first capacitor coupled between a second prescribed voltage and a junction coupling the first and second PMOS type transistors, wherein the second symmetric circuit comprises,
first and second NMOS type transistors coupled in series between the output node of the amplification stage and the second prescribed voltage, and
a second capacitor coupled between the second prescribed voltage and a junction coupling the first and second NMOS type transistors.

23. The RF communication system of claim 21, wherein each symmetric circuit is connected to a single input terminal.

24. The RF communication system of claim 23, wherein each symmetric circuit comprises:
first and second transistors coupled in series between a prescribed voltage and an output node of the corresponding amplification stage; and
a capacitor coupled to a junction connecting the first and second transistors.

25. A CMOS low noise amplifier (LNA), comprising:
a plurality of amplification stages coupled between an input terminal and an output terminal;
a gain controller coupled to each of the plurality of amplifier stages, wherein each of the amplification stages comprises first and second symmetric circuits; and
a feedback loop coupled between an output node of said each amplification stage and the second symmetric circuit, wherein said first circuit comprises,
first and second first-conduction type transistors coupled in series between a first prescribed voltage and a corresponding output node of the amplification stage, and
a first capacitor coupled between a second prescribed voltage and a junction coupling the first and second first-conduction type transistors, wherein the second circuit comprises,
first and second second-conduction type transistors coupled in series between the output node of the amplification stage and the second prescribed voltage, and
a second capacitor coupled between the second prescribed voltage and a junction coupling the first and second second-conduction type transistors.

26. A CMOS low noise amplifier (LNA) comprising:
a plurality of amplification stages coupled between an input terminal and an output terminal; and
a gain controller coupled to each of the plurality of amplifier stages, wherein the CMOS LNA does not include a spiral inductor, and wherein the gain controller comprises,
a gain transistor and a gain current source coupled in series between a first prescribed voltage and a second prescribed voltage, and
a gain capacitor coupled between the second prescribed voltage and a control electrode of the gain transistor, and wherein a control electrode and a second electrode of the gain transistor are coupled together.

27. An amplification stage for a low noise amplifier (LNA), comprising:
first and second circuits coupled between an input node and an output node, wherein the first and second circuits have a symmetric configuration; and
a feedback loop coupled between the output node and the second circuit, wherein the feedback loop comprises,
a first operational amplifier having an output coupled to a control electrode of transistor,
a first resistor coupled to the output node of the amplification stage and a first input of the first operational amplifier, and
a capacitor coupled between a second prescribed voltage and the first input of the operational amplifier, and wherein a second input terminal of the first operational amplifier is coupled to a third prescribed voltage, wherein a level of the third prescribed voltage is between levels of a first prescribed voltage and the second prescribed voltage.

* * * * *